US012492466B2

(12) United States Patent
Islam et al.

(10) Patent No.: US 12,492,466 B2
(45) Date of Patent: Dec. 9, 2025

(54) PROTECTIVE CERAMIC COATINGS FOR METAL SUBSTRATES

(71) Applicants: Rafiqul Islam, Gilbert, AZ (US); Francois Perreault, Tempe, AZ (US)

(72) Inventors: Rafiqul Islam, Gilbert, AZ (US); Francois Perreault, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 62 days.

(21) Appl. No.: 18/307,674

(22) Filed: Apr. 26, 2023

(65) Prior Publication Data

US 2023/0340664 A1 Oct. 26, 2023

Related U.S. Application Data

(60) Provisional application No. 63/334,900, filed on Apr. 26, 2022.

(51) Int. Cl.

*C23C 16/34* (2006.01)
*C23C 16/40* (2006.01)
*C23C 16/455* (2006.01)
*C23C 28/04* (2006.01)

(52) U.S. Cl.

CPC .......... *C23C 16/342* (2013.01); *C23C 16/403* (2013.01); *C23C 16/405* (2013.01); *C23C 16/45527* (2013.01); *C23C 28/042* (2013.01)

(58) Field of Classification Search

CPC ................ C23C 16/342; C23C 16/403; C23C 16/45525; C23C 16/45527

See application file for complete search history.

(56) References Cited

U.S. PATENT DOCUMENTS 4,721,534 A * 1/1988 Phillippi .................. G01K 1/08 374/163
6,666,921 B2 * 12/2003 Sakai ................ C23C 16/45502 118/728
2002/0014460 A1 * 2/2002 McKay ................ C02F 1/4606 210/696

(Continued)

FOREIGN PATENT DOCUMENTS

WO 2016007175 A1 1/2016

OTHER PUBLICATIONS

Fusco et al., "Investigation of the Corrosion Behavior of Atomic Layer Deposited Al2O3/TiO2 Nanolaminate Thin Films on Copper in 0.1 M NaCl", 2019, Materials 12, p. 672 (Year: 2019).*

(Continued)

*Primary Examiner* — Robert A Vetere
(74) *Attorney, Agent, or Firm* — Fish & Richardson P.C.

(57) ABSTRACT

A coated substrate includes a metallic substrate and a ceramic coating on the metallic substrate. The ceramic coating includes one or more layers, and a total thickness of the ceramic coating is in a range of 2 nm to 200 nm. Coating a metallic substrate includes disposing a first ceramic coating layer on the metallic substrate and disposing one or more additional ceramic coating layers on the first ceramic coating layer to yield a laminated substrate. A total thickness of the ceramic coating layers on the laminated substrate is in a range of 2 nm to 200 nm.

8 Claims, 7 Drawing Sheets

(56) References Cited

U.S. PATENT DOCUMENTS

2007/0187134 A1* 8/2007 Detian .................. H01B 11/20
174/126.1
2017/0275154 A1* 9/2017 Yee ...................... B81B 7/0058

OTHER PUBLICATIONS

Diaz et al., "Electrochemical and time-of-flight secondary ion mass spectrometry analysis of ultra-thin metal oxide ($Al_2O_3$ and $Ta_2O_5$) coatings deposited by atomic layer deposition on stainless steel," 2011, Electrochimica Acta 56, pp. 10516-10523. (Year: 2011).*
Abdulagatov, A. I., et al. "Al2O3 and TiO2 atomic layer deposition on copper for water corrosion resistance." ACS applied materials & interfaces 3.12 (2011): 4593-4601.
Baker, Wafer Bonding Between LiTaO3(100) and Alpha-quartz SiO2(100) via Low Temperature (<220° C.) NanoBondingTM Using Surface Energy Modification, in: AVS 65th Int. Symp. Exhib., 2018: p.
Bi, Yuqiang, et al. "Four release tests exhibit variable silver stability from nanoparticle-modified reverse osmosis membranes." Water research 143 (2018): 77-86.
Birmele, Michele, Michael Roberts, and LaShelle McCoy. "Disinfection of spacecraft potable water systems by passivation with ionic silver." 41st International conference on environmental systems, pp. 1-8, 2011.
Chilkoor, Govinda, et al. "Hexagonal boron nitride: the thinnest insulating barrier to microbial corrosion." ACS nano 12.3 (2018): 2242-2252.
Cornejo, Christian E., et al. "Measuring Surface Energies of GaAs (100) and Si (100) by Three Liquid Contact Angle Analysis (3LCAA) for Heterogeneous Nano-BondingTM." MRS Advances 3.57-58 (2018): 3403-3411.
Dameron, Arrelaine A., et al. "Gas diffusion barriers on polymers using multilayers fabricated by Al2O3 and rapid SiO2 atomic layer deposition." The Journal of Physical Chemistry C 112.12 (2008): 4573-4580.
De Faria, Andreia F., et al. "Antimicrobial electrospun biopolymer nanofiber mats functionalized with graphene oxide-silver nanocomposites." ACS applied materials & interfaces 7.23 (2015): 12751-12759.
Díaz, Belén, et al. "Electrochemical and time-of-flight secondary ion mass spectrometry analysis of ultra-thin metal oxide (Al2O3 and Ta2O5) coatings deposited by atomic layer deposition on stainless steel." Electrochimica Acta 56.28 (2011): 10516-10523.
Díaz, Belén, et al. "Low-temperature atomic layer deposition of Al2O3 thin coatings for corrosion protection of steel: Surface and electrochemical analysis." Corrosion science 53.6 (2011): 2168-2175.
Dingemans, Gijs, and W. M. M. Kessels. "Status and prospects of Al2O3-based surface passivation schemes for silicon solar cells." Journal of Vacuum Science & Technology A 30.4 (2012), pp. 1-48.
Faria, Andreia F., et al. "Thin-film composite forward osmosis membranes functionalized with graphene oxide-silver nanocomposites for biofouling control." Journal of Membrane Science 525 (2017): 146-156.
Fusco, Michael A., Christopher J. Oldham, and Gregory N. Parsons. "Investigation of the corrosion behavior of atomic layer deposited Al2O3/TiO2 nanolaminate thin films on copper in 0.1 M NaCl." Materials 12.4 (2019): 672, pp. 1-24.
Hsain, Zakaria, et al. "Wear behavior of annealed atomic layer deposited alumina." Wear 372 (2017): 139-144.
Hues, Steven M., Charles F. Draper, and Richard J. Colton. "Measurement of nanomechanical properties of metals using the atomic force microscope." Journal of Vacuum Science & Technology B: Microelectronics and Nanometer Structures Processing, Measurement, and Phenomena 12.3 (1994): 2211-2214.
Jogiaas, Taivo, et al. "Hardness and modulus of elasticity of atomic layer deposited Al2O3—ZrO2 nanolaminates and mixtures." Materials Chemistry and Physics 240 (2020): 122270, pp. 1-7.
Koch, Gerhardus. "Cost of corrosion." Trends in oil and gas corrosion research and technologies (2017): 3-30.
Li, Wenyan, et al. "Investigation of silver biocide as a disinfection tehcnology for spacecraft—an early literature review." 48th International Conference on Environmental Systems, 2018, 17 pages.
Li, Yangfan, and Chengyun Ning. "Latest research progress of marine microbiological corrosion and bio-fouling, and new approaches of marine anti-corrosion and anti-fouling." Bioactive materials 4 (2019): 189-195.
Lindner, Paul, et al. "3D interconnect through aligned wafer level bonding." 52nd Electronic Components and Technology Conference 2002.(Cat. No. 02CH37345). IEEE, 2002, 1439-1443.
Liu, Zheng, et al. "Ultrathin high-temperature oxidation-resistant coatings of hexagonal boron nitride." Nature communications 4.1 (2013): 2541, 8 pages.
Liu, Xuwen, et al. "On the reliability of nanoindentation hardness of Al2O3 films grown on Si-wafer by atomic layer deposition." Journal of Vacuum Science & Technology A 32.1 (2014), 6 pages.
Lorenzo-Martin, C., et al. "Effect of Al2O3 coating on fretting wear performance of Zr alloy." Wear 426 (2019): 219-227.
Marambio-Jones, Catalina, and Eric MV Hoek. "A review of the antibacterial effects of silver nanomaterials and potential implications for human health and the environment." Journal of nanoparticle research 12 (2010): 1531-1551.
Marin, E., et al. "Chemical and electrochemical characterization of TiO 2/Al 2 O 3 atomic layer depositions on AZ-31 magnesium alloy." Journal of Coatings Technology and Research 9 (2012): 347-355.
Masalski, J., et al. "Improvement in corrosion resistance of the 316I stainless steel by means of Al2O3 coatings deposited by the sol-gel method." Thin solid films 349.1-2 (1999): 186-190.
Mesa, D. H., et al. "The effect of testing temperature on corrosion-erosion resistance of martensitic stainless steels." Wear 255.1-6 (2003): 139-145.
Narayan, Saaketh R., et al. "Comparative study of surface energies of native oxides of Si (100) and Si (111) via three liquid contact angle analysis." MRS Advances 3.57-58 (2018): 3379-3390.
Oukarroum, Abdallah, et al. "Inhibitory effects of silver nanoparticles in two green algae, *Chlorella vulgaris* and *Dunaliella tertiolecta*." Ecotoxicology and environmental safety 78 (2012): 80-85.
Oukarroum, Abdallah, et al. "Temperature influence on silver nanoparticles inhibitory effect on photosystem II photochemistry in two green algae, *Chlorella vulgaris* and *Dunaliella tertiolecta*." Environmental Science and Pollution Research 19 (2012): 1755-1762.
Petala, Maria, et al. "Silver deposition on stainless steel container surfaces in contact with disinfectant silver aqueous solutions." Applied Surface Science 396 (2017): 1067-1075.
Rice, Douglas, et al. "Development of anti-biofouling feed spacers to improve performance of reverse osmosis modules." Water research 145 (2018): 599-607.
Roman, Monsi C., et al. "Assessment of Microbiologically Influenced Corrosion Potential in the International Space Station Internal Active Thermal Control System Heat Exchanger Materials: A 6-Month Study." SAE transactions (2005): 606-617.
Shan, C. X., Xianghui Hou, and Kwang-Leong Choy. "Corrosion resistance of TiO2 films grown on stainless steel by atomic layer deposition." Surface and Coatings Technology 202.11 (2008): 2399-2402.
Steele, John, Timothy Nalette, and Durwood Beringer. Method for Reduction of Silver Biocide Plating on Metal Surfaces, NASA Tech Br. , No. MSC-24875-1. 2013, p. 9.
Tanjil, Md Rubayat-E., et al. "Ångström-scale, atomically thin 2D materials for corrosion mitigation and passivation." Coatings 9.2 (2019): 133, 30 pages.
Tripp, Marie K., et al. "The mechanical properties of atomic layer deposited alumina for use in micro- and nano-electromechanical systems." Sensors and Actuators A: Physical 130 (2006): 419-429.
Vance, John, and Lance Delzeit. "Mitigation of Silver Ion Loss from Solution by Polymer Coating of Metal Surfaces." International Conference on Environmental Systems. No. ARC-E-DAA-TN68316. 2019, 10 pages.

(56) References Cited

OTHER PUBLICATIONS

Vance, John, and Lance Delzeit. "Mitigation of Silver lon Loss from Solution by Polymer Coating of Metal Surfaces, Part III." 50th International Conference on Environmental Systems, 2021, 12 pages.
Yemini, Reut, et al. "Biofilm-Protected Catheters Nanolaminated by Multiple Atomic-Layer-Deposited Oxide Films." ACS Applied Nano Materials 4.6 (2021): 6398-6406.
Zhang, H., Y. L. Zhao, and Z. D. Jiang. "Effects of temperature on the corrosion behavior of 13Cr martensitic stainless steel during exposure to CO2 and Cl-environment." Materials Letters 59.27 (2005): 3370-3374.
Ziemniak, S. E., and M. Hanson. "Zinc treatment effects on corrosion behavior of 304 stainless steel in high temperature, hydrogenated water." Corrosion Science 48.9 (2006): 2525-2546.
Zink, B. L., et al. "Excess modes and enhanced scattering in rare-earth-doped amorphous silicon thin films." Physical Review B 74.20 (2006): 205209, 7 pages.
Dobrzański, Leszek, et al. "Silicon solar cells with Al2O3 antireflection coating." Open Physics 12.9 (2014): 666-670.
Cornejo, M. Bertram, N. Herbots, R.J. Culbertson, Direct Heterogeneous Nano-Bonding TM of GaAs ( 100 ) to Si ( 100 ) at Near Atmospheric Pressure Below 220° C., (2018) 220-222. doi:10.13140/RG.2.2.10977.61285.
Koch, J. Varney, N. Thompson, O. Moghissi, M. Gould, J. Payer, International Measures of Prevention, Application, and Economics of Corrosion Technologies Study, NACE Int. (2016) 216 pages.

* cited by examiner

PROTECTIVE CERAMIC COATINGS FOR METAL SUBSTRATES

CROSS-REFERENCE TO RELATED APPLICATION

This application claims the benefit of U.S. patent application No. 63/334,900 filed on Apr. 26, 2022, which is incorporated herein by reference in its entirety.

STATEMENT OF GOVERNMENT INTEREST

This invention was made with government support under 80NSSC20C0320 awarded by the National Aeronautics and Space Administration. The government has certain rights in the invention.

TECHNICAL FIELD

This invention relates to ceramic coatings for the prevention or inhibition of metal deposition, microorganism growth, and corrosion on metal substrates.

BACKGROUND

Ionic silver, added as the soluble silver fluoride (AgF) salt, is used in water distribution systems to control the growth of microorganisms in water. Due to the high antimicrobial activity of $Ag^+$, ionic silver is an excellent approach to control the proliferation of microorganisms suspended in water. However, silver ions have limitations when it comes to long term control of biofilm growth in water treatment systems, either during operations or in dormant periods. The water-soluble silver forms tend to quickly react with surfaces such as stainless steel and is removed from the water. The low lifetime of silver ions in the water phase creates potential risks for biofilm growth, which ultimately leads to health risks and system damage. This process is a galvanic deposition process, triggering the reduction of silver ions to metallic silver/silver oxides on the surface.

SUMMARY

This disclosure describes a stable redox insulative coating of ceramic material on the surface of a metallic substrate, as well as the coated substrates, to limit corrosion, microbial growth, and galvanic deposition of other metals (e.g., silver). Examples of suitable insulating ceramic-type two-dimensional (2D) materials coating include aluminum oxide ($Al_2O_3$, also known as alumina) and hexagonal boron nitride (hBN). Examples of suitable metallic substrates include components of biocidal water purification systems and medical devices.

Homogeneous coating of the disclosed ceramic materials on metallic substrates (e.g., stainless steel or other alloys, titanium) can be achieved by thin film deposition techniques (e.g., atomic layer deposition and chemical vapor deposition), which allow for a controllable thickness to be deposited on the surface. The insulating nature of these coatings is shown to prevent or inhibit the galvanic deposition of silver on the metallic substrate. These coatings can be applied to materials of very high aspect ratio (up to 1:2500), making them appropriate for coatings on high surface to volume ratio structures such as pipes and tubes.

In a first general aspect, a coated substrate includes a metallic substrate and a ceramic coating on the metallic substrate. The ceramic coating includes one or more layers, and a total thickness of the ceramic coating is in a range of 2 nm to 200 nm.

Implementations of the first general aspect can include one or more of the following features.

In some cases, the total thickness of the ceramic coating is in a range of 5 nm to 50 nm. In some implementations, the ceramic coating includes aluminum oxide. The ceramic coating can include hexagonal boron nitride. In some cases, the ceramic coating includes one or more of hafnium oxide, titanium oxide, and molybdenum disulfide. In some implementations, the ceramic coating includes two or more layers. The metallic substrate can include a metal or metal alloy. In some cases, the metallic substrate includes stainless steel or titanium. In some implementations, the ceramic coating inhibits or prevents the deposition of silver on the coated substrate. The ceramic coating can inhibit or prevent microbial growth on the coated substrate. In some cases, the metallic substrate includes a component of a biocidal water purification system. In some implementations, the metallic substrate includes a medical device.

In a second general aspect, coating a metallic substrate includes disposing a first ceramic coating layer on the metallic substrate and disposing one or more additional ceramic coating layers on the first ceramic coating layer to yield a laminated substrate. A total thickness of the ceramic coating layers on the laminated substrate is in a range of 2 nm to 200 nm.

Implementations of the second general aspect can include one or more of the following features.

In some implementations, the total thickness of the ceramic coating layers on the laminated substrate is in a range of 5 nm to 50 nm. In some cases, disposing the first ceramic coating layer on the metallic substrate includes contacting the metallic substrate with trimethylaluminium at a temperature in a range of 1700° C. to 1900° C. to form a layer of aluminum oxide on the metallic substrate. In some implementations, disposing the first ceramic coating layer on the metallic substrate includes contacting the metallic substrate with a mixture borazine and hydrogen and ethylene to form a layer of hexagonal boron nitride on the metallic substrate. In some implementations, the second general aspect includes atomic layer deposition or chemical vapor deposition. In some cases, the metallic substrate includes a metal or metal alloy. The metallic substrate can include stainless steel or titanium. In some implementations, the metallic substrate includes a component of a biocidal water purification system. In some cases, metallic substrate includes a medical device.

The ceramic coatings are stable at high temperature and, due at least in part to the use of thin film deposition techniques, tightly bound to the metallic substrate surface. These characteristics prevent or inhibit coating detachment under conditions such as high water temperature, high shear forces, and extreme pH. Ceramic materials that are 40-100 times harder than parylene-C or Teflon™ AF2400 can be used, thereby limiting the risk of coating damage. The coatings are effective at a much lower thickness than polymer coatings. Results disclosed herein show <3% 7-day silver loss on 316L stainless steel coated with only 25 nm of ceramic materials. The effectiveness of the coatings at nanometer thicknesses allows them to be used on substrates with complex geometries such as SWAGELOK® fittings and flex bellows.

The details of one or more embodiments of the subject matter of this disclosure are set forth in the accompanying drawings and the description. Other features, aspects, and advantages of the subject matter will become apparent from the description, the drawings, and the claims.

DETAILED DESCRIPTION

This disclosure describes the coating of insulating ceramic material on the surface of a metallic substrate, as well as the coated substrates, to limit corrosion, microbial growth, and galvanic deposition of other metals on the metallic substrate. Examples of suitable insulating ceramic-type two-dimensional (2D) material coatings include aluminum oxide and hexagonal boron nitride. Aluminum oxide ($Al_2O_3$, also known as alumina) is an insulating material that is stable in water and non-toxic (toxicity class 0) to humans. Hexagonal boron nitride (hBN) is an insulating material that can inhibit or prevent redox reactions on metallic substrates for corrosion prevention. Examples of suitable substrates include metals and metal alloys, such as stainless steel (SS). As described herein, 2D materials are generally understood to be materials that have a measurement in one dimension (e.g., a thickness) of less than 1 micrometer.

Uniform coating on a metallic substrate can be achieved by thin film deposition techniques such as atomic layer deposition and chemical vapor deposition, which allow for a controllable thickness of the coating on the substrate. These coatings can be applied on substrates with high aspect ratios (e.g., up to 1:2500), making them appropriate for coatings on high surface to volume (S/V) ratio structures such as cylindrical substrates (e.g., pipes, tubes, and the like).

Figure 1:
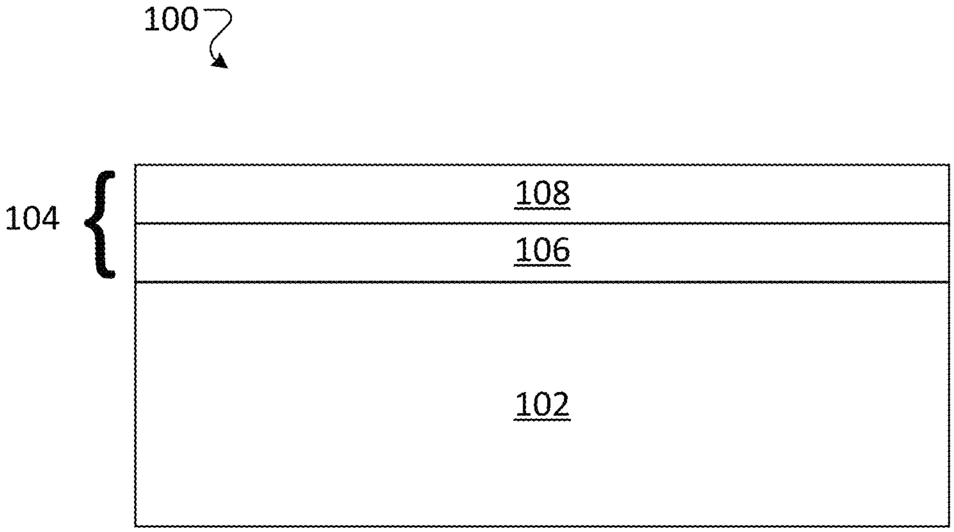
FIG. 1 depicts a metallic substrate with a ceramic coating having two layers.

Thin film deposition techniques can provide a continuous and uniform surface coating of controllable thickness. FIG. 1 depicts coated substrate 100. Coated substrate 100 includes metallic substrate 102 and ceramic coating 104. Ceramic coating 104 includes first ceramic coating layer 106 and second ceramic coating layer 108. Each ceramic coating layer can include aluminum oxide or hexagonal boron nitride. In some cases, a ceramic coating layer can include one or more of hafnium oxide, titanium oxide, and molybdenum disulfide. In some cases, a total thickness of the ceramic coating is in a range of 2 nm to 200 nm or 5 nm to 50 nm (e.g., 10 to 40 nm, 20 to 30 nm, or 25 nm). Suitable metals for the metallic substrate 102 include metals and metal alloys (e.g., stainless steel, titanium). The ceramic coating described herein can function as an insulator on metallic substrates and inhibit or prevent the galvanic deposition of metal species on the metallic substrate surface.

The coated metallic substrates can include components of biocidal water purification systems that use silver as a biocide. The ceramic coating on the components inhibits or prevents the loss of silver ions in the water over time. Because the disclosed ceramic coatings are effective at nanoscale thickness (e.g., 2 nm to 200 nm, 5 nm to 50 nm, 10 nm to 40 nm, 20 nm to 30 nm, or 25 nm), these coatings are suitable for applications that typically require low-dimensional tolerances. Examples of substrates requiring low-dimensional tolerances that can be used as components of biocidal water purification systems include SWAGELOK® fittings and flex bellows.

Ceramic materials such as alumina or hexagonal boron nitride with a hardness 40-100 times than that of parylene-C or Teflon™ AF2400 can be used for ceramic coatings described herein, thereby limiting the risk of coating damage. These ceramic materials are also stable at high temperature and, due at least in part to the selected coating procedures (e.g., ALD), tightly bound to the substrate surface. This tight bonding can reduce or prevent coating detachment, even at elevated temperatures, extreme pH, and when exposed to high shear stresses.

Stainless steels are alloys that can be used for a wide range of applications even in aggressive environments, such as in low/high pH waters, hydroelectric energy production components, marine environment, or in contact with body tissues. In particular circumstances, stainless steels may benefit from a further improvement of corrosion protection. Ceramic coatings can possess good thermal and electrical properties and are resistant to oxidation and erosion in high temperature environments. These properties are useful in applications such as pipelines, castings, and automotive parts. The disclosed 2D ceramic coatings have mechanical properties and corrosion resistance that can be advantageous in applications such as surface passivation, gas diffusion barriers, and anti-reflection layers.

Figure 2:
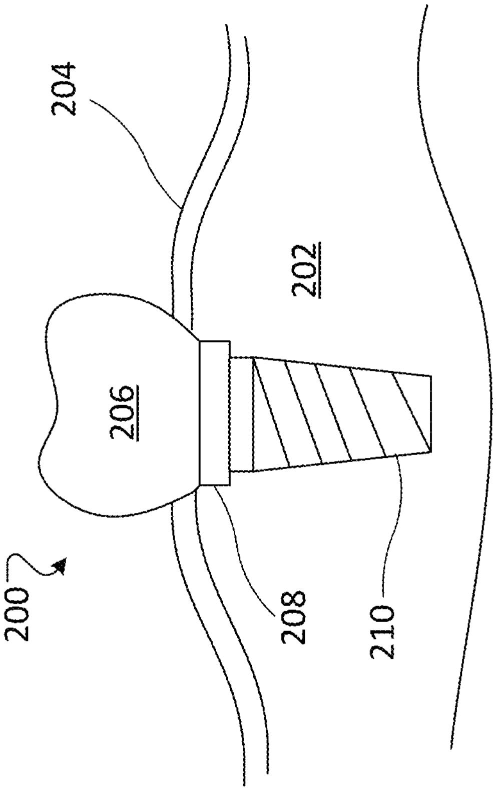
FIG. 2 depicts a dental implant.
Figures 3A, 3B, 3C, 3D:
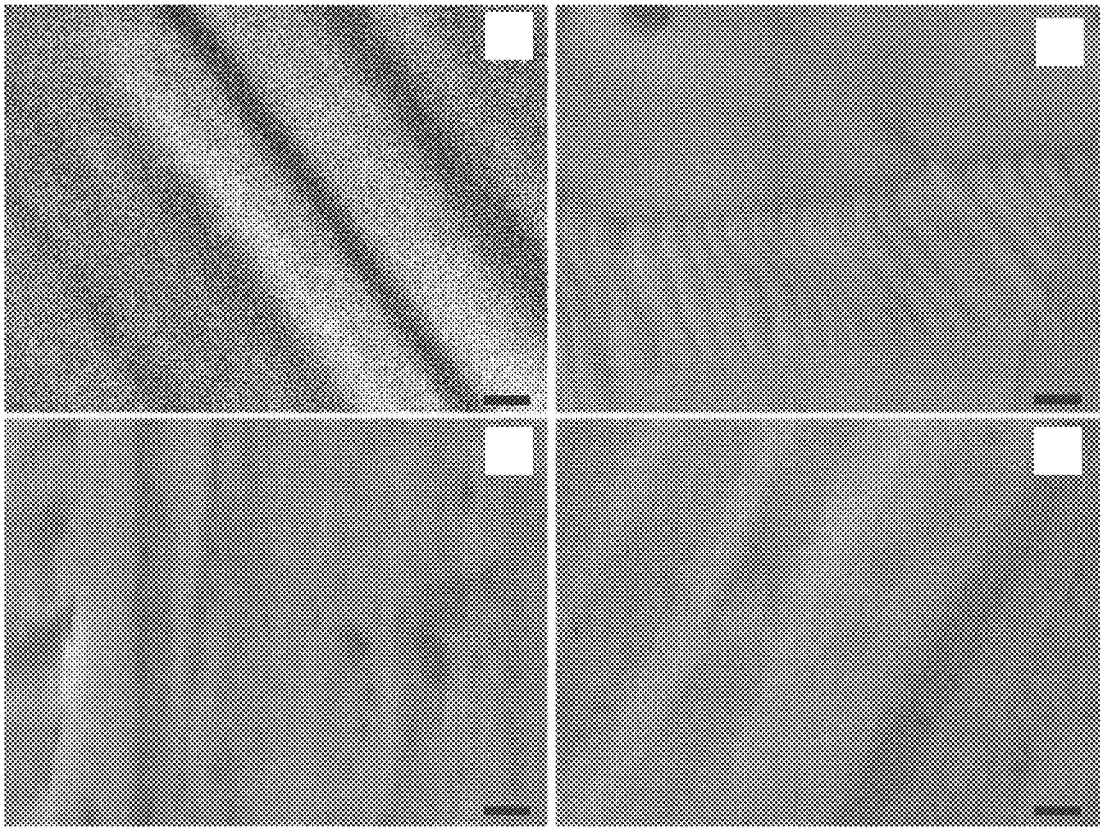
FIG. 3A is a SEM micrograph of pristine 316L SS.
FIGS. 3B-3D are SEM micrographs of 316L SS coated with 10, 25, and 50 nm $Al_2O_3$, respectively. The scale bar represents 1 μm for all images.

Prevention or inhibition of microbial growth on medical devices can reduce or eliminate infections and other complications, such as the rejection of the medical device or a medical implant by the body. Coated nanoscale thick laminated films have been prepared with combinations of metal oxides and with accurate control over the film thickness and composition by ALD. These anti-biofilm nanolaminated coatings diminish the number of bacteria on surfaces compared to that of untreated substrates (e.g., catheters) by several orders of magnitude. These methods of 2D ceramic coating can be applied to the coating of medical devices with materials such as alumina, which is FDA approved for a variety of applications. Medical devices suitable for ceramic coating include stents, catheters, pacemaker enclosures, artificial joints, bone fixators, spinal fixators, and medical implants (e.g., dental implants). FIG. 2 depicts dental implant 200 secured in bone 202. Bone 202 is covered by gums 204. Crown 206 is coupled to abutment 208, abutment 208 is coupled to post 210, and post 210 is coupled to bone 202. Abutment 208 and post 210 include a metal (e.g., titanium) or metal alloy (e.g., stainless steel) that is coated with one or two or more ceramic coating layers (e.g., aluminum oxide). A total thickness of the ceramic coating layers is typically between 2 nm and 200 nm (e.g., 5 nm and 50 nm, 10 nm and 40 nm, 20 nm and 30 nm, or 25 nm).

A method of coating a metallic substrate (e.g., stainless steel or other alloy, titanium) includes disposing a first ceramic coating layer on the metallic substrate, and disposing one or more additional ceramic coating layers on the first ceramic layer to yield a laminated substrate. A total thickness of the ceramic coating layers on the laminated substrate is in a range of 2 nm to 200 nm (e.g., 5 nm to 50 nm). In one example, disposing the first ceramic coating layer on the metallic substrate includes contacting the metallic substrate with trimethylaluminium at a temperature in a range of 1700° C. to 1900° C. to form a layer of aluminum oxide on the metallic substrate. In one example, disposing the first ceramic coating layer on the metallic substrate includes contacting the metallic substrate with a borazine and hydrogen mixture and ethylene to form a layer of hexagonal boron nitride on the metallic substrate. In some examples, disposing the ceramic coating on the metallic substrate includes atomic layer deposition. In certain examples, disposing the ceramic coating on the metallic substrate includes chemical vapor deposition. Suitable examples of metallic substrates include biocidal water purification system components and medical devices (e.g., medical implants).

EXAMPLES 316L stainless steel (SS) was used as a model surface for treatment. The 316L SS coupons were obtained from McMaster-Carr (Elmhurst, TL) and cut into a 4-inch diameter size to be coated with $Al_2O_3$ or hexagonal boron nitride (hBN). For $Al_2O_3$ coating, a trimethylaluminium (TMA, $(CH_3)_3Al$) precursor was used to grow the alumina layer on SS. The thickness was varied from 5 nm to 50 nm by varying the number of growth cycles. The growth rate was 0.1 nm per cycle at a temperature of 1700° C. to 1900° C. A Woollam ellipsometer was used to measure average film thickness (21 point measurement) with the average film index being 1.6490 at 632.8 nm. The ellipsometry measurement suggested a uniformity of variation of <1% on flat surfaces. Similarly, 2D material hBN was deposited by chemical vapor deposition (CVD). Through the CVD method, hBN was synthesized on the metal surface (serving as the catalyst) using borazine ($B_3N_3H_6$) and $H_2$ mixed with ethylene. Table 1 shows the elemental composition of the 316L SS surface before and after coating with either $Al_2O_3$ or hBN. The disappearance of the peaks associated with 316L SS (e.g., Fe, Cr, Mn) in the $Al_2O_3$ coated sample indicates that the coating was uniform and achieved complete surface coverage.

TABLE 1

Elemental composition of the 316L SS pristine and coated with $Al_2O_3$ or hBN, as determined by X-ray photoelectron spectroscopy (XPS) analyses

| Samples | % C | % O | % Fe | % Cr | % Mn | % N | % Al | % B |
|---|---|---|---|---|---|---|---|---|
| 316L SS | 14.27 | 44.97 | 17.88 | 17.52 | 5.36 | n.d. | n.d. | n.d. |
| 316L SS + $Al_2O_3$ | 10.92 | 78.94 | n.d. | nd | n.d. | nd | 10.15 | nd |
| 316L SS + hBN | 14.51 | 38.15 | n.d. | 8.00 | n.d. | 30.25 | nd | 9.10 |

The morphology of the coated and uncoated surface was characterized by atomic force microscopy (AFM) and scanning electron microscopy (SEM). The AFM imaging was performed by tapping mode on a Multimode 8 Bruker AFM. The SEM micrographs were collected on an ESEM-FEG XL-30 (Philips Hitachi), which was equipped with an energy dispersive X-ray spectrometer (EDX).

A thin film deposition method was applied to generate ceramic coatings of different thicknesses ranging from 5 nm to 50 nm on 316L SS. AFM images showed that the surface morphology of the pristine 316L SS and the same material coated with 10 nm and 50 nm of alumina did not appear to be altered, indicating that the thin alumina layer was conformal (e.g., followed the surface topography to coat the surface). No gaps were found in the coating applied on the SS surfaces.

Similar conclusions were obtained from SEM imaging. FIGS. 3A-3D show SEM images for pristine 316L SS and for 316L SS coated with 10, 25, and 50 nm of 2D alumina, respectively. The images show a surface coating without any visible defects and of uniform morphology. These SEM images confirm a uniform surface coating for all coating thicknesses. Because this coating uniformity influences silver loss protection, the quality of the coating coverage demonstrates the potential to prevent redox reactions at the surface when exposed to biocidal silver fluoride (AgF) solutions.

Figure 4:
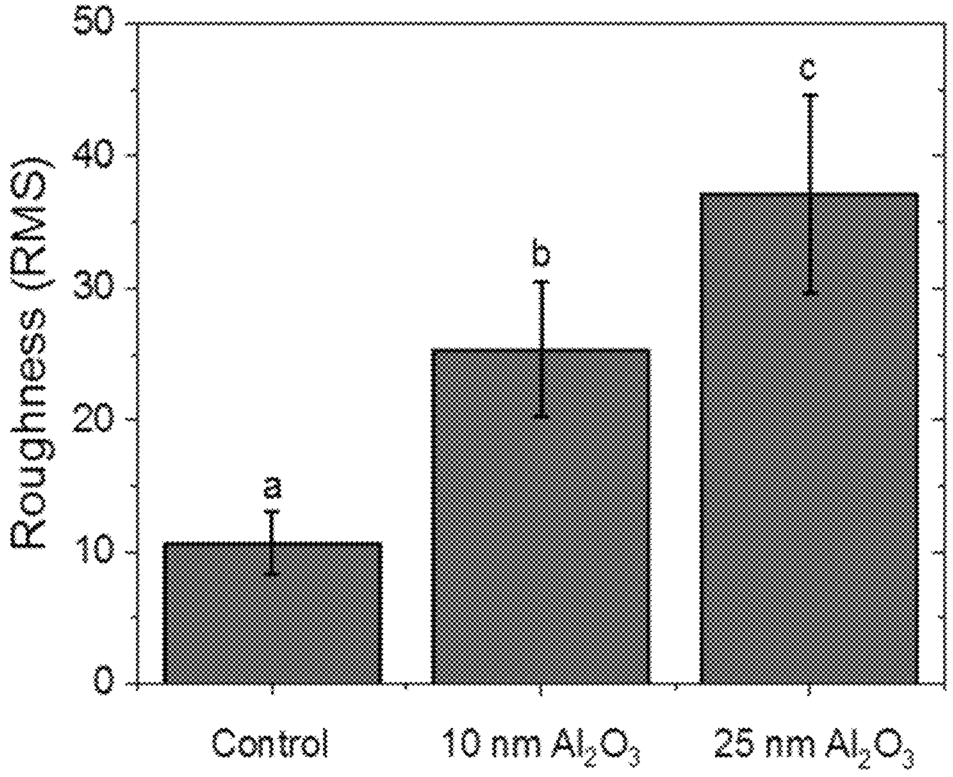
FIG. 4 shows atomic force microscopy (AFM) surface roughness (root mean square) of pristine 316L stainless steel (SS) (control) and SS coated with 10 nm $Al_2O_3$ and 25 nm $Al_2O_3$.

Change in the surface morphology was also analyzed by surface roughness calculations using AFM images. The change in root mean square (RMS) surface roughness is shown in FIG. 4. The results indicate that functionalizing the 316L SS surface with 2D alumina increases the surface roughness when compared to pristine SS (control). As quantified by AFM, the control SS showed an average surface roughness of 10.6 nm±2.35, while the coated SS had values of 25.3 nm±5.14, 37.1 nm±7.49 for 10 nm, and 25 nm $Al_2O_3$-treated samples, respectively. This suggests that the coating may have non-uniformities across the surface. To analyze how the 2D alumina coating affects surface morphology, the uniformity of the alumina coating was analyzed using ellipsometry. Due to technical constraints, this analysis was done on a silicon wafer and not on 316L SS. The ellipsometry analysis indicated that there was ~3 nm variation in coating thickness in a ~24 nm alumina coating applied to the wafer. This variation may increase with coating thickness and is likely to be exacerbated on the rougher and more heterogeneous 316L SS surface compared to a silicon wafer. However, in order to fit the coupons on the 12 mm mounting on the AFM coupons, samples had to be cut. This cutting process may have damaged or displaced the coating and altered the roughness measured by AFM.

Step-height measurements were performed on SS 316 coupons functionalized with 10 nm and 50 nm $Al_2O_3$ using atomic layer deposition (ALD). The thickness was measured by placing a semiconductor tape in the middle of a virgin wafer and then placing the SS samples close to the surroundings of the center of the wafer. Since all the coupons were coated on both sides, the thickness was doubled. Therefore, by dividing the thicknesses in half, 50 nm $Al_2O_3$ and 10 nm $Al_2O_3$ samples showed 50 nm and 11 nm thicknesses, respectively. These values verify the accuracy of the ALD process with regard to coating thickness.

The composition of the coatings at different thicknesses was evaluated by X-ray photoelectron spectroscopy (XPS) elemental analysis for samples before and after AgF exposure. As provided in Table 1, the addition of an $Al_2O_3$ layer masks the signal from the 316L SS substrate, indicating complete surface coverage. After AgF exposure, the alumina-coated sample did not show any peak associated with Ag, although a fluoride (F) peak is observed in XPS spectra and quantified in Table 2. This suggests that either silver does not interact with the alumina-coated sample or that its reaction does not occur on the alumina layer. In comparison, pristine 316L SS exposed to AgF shows the appearance of an Ag peak in the XPS analysis, listed in Table 2. The absence of Ag peaks in alumina-coated samples is consistent across all coating thicknesses.

TABLE 2

XPS elemental analyses of the 316L SS and 2D alumina coated SS.

| Samples | % C | % O | % Fe | % Cr | % Mn | % N | % Al | % F | % Ag |
|---|---|---|---|---|---|---|---|---|---|
| 316L SS pristine | 14.27 | 44.97 | 17.88 | 17.52 | 5.36 | n.d. | n.d. | n.d. | n.d. |
| 316L SS after AgF exposure[1] | 16.29 | 40.95 | 31.4 | 10.21 | n.d. | n.d. | n.d. | n.d. | 1.15 |
| 316L SS + 50 nm $Al_2O_3$ after AgF exposure[1] | 16.19 | 73.23 | n.d. | n.d. | n.d. | n.d. | 9.15 | 1.43 | n.d. |
| 25 nm $Al_2O_3$ after AgF exposure[1] | 8.57 | 79.2 | n.d. | n.d. | n.d. | n.d. | 9.57 | 2.66 | n.d. |
| 10 nm $Al_2O_3$ after AgF exposure[1] | 13.21 | 78.1 | n.d. | n.d. | n.d. | n.d. | 6.73 | 1.96 | n.d. |

[1]Samples measured after 7 days exposure to 0.4 ppm AgF.

Capacitance-voltage (C-V) measurements can be employed for a number of purposes such as determining the properties of a dielectric material. This approach was used to characterize the insulating properties of the 2D alumina coatings. For an ideal metal-dielectric-metal structure, there should be little or no capacitance variation with frequency or applied bias. Based on C-V measurement data for both 10 nm and 25 nm $Al_2O_3$-coated SS samples, the capacitance is small (~10 pF) and fixed across the voltage range. This indicates that there was no aluminum oxide dielectric leak in the SS samples. In comparison, a 10 nm $Al_2O_3$-coated SS sample that was intentionally damaged by cutting the sample to expose the SS surface at the edges shows much higher capacitance (~46 pF), and this value varied across the voltage range. This contrast between the intact and damaged samples demonstrates the effectiveness of the alumina coating in insulating the metallic surface.

SS coupons coated with different thicknesses (5 nm-50 nm) of $Al_2O_3$ were placed in a solution of deionized water with 0.4 ppm of silver added as AgF. Samples were exposed to the AgF solution at a surface to volume (S/V) ratio of 2. The samples were immersed in the AgF solution in sealed tubes on an orbital shaker at 50 rpm for 7 and 14 days. Once the coupons were removed from the tubes, the remaining liquid was acidified to 2% $HNO_3$ using trace metal grade $HNO_3$, and the concentration of silver remaining in the solution was measured using inductively coupled plasma mass spectroscopy (ICP-MS).

Figure 5A:
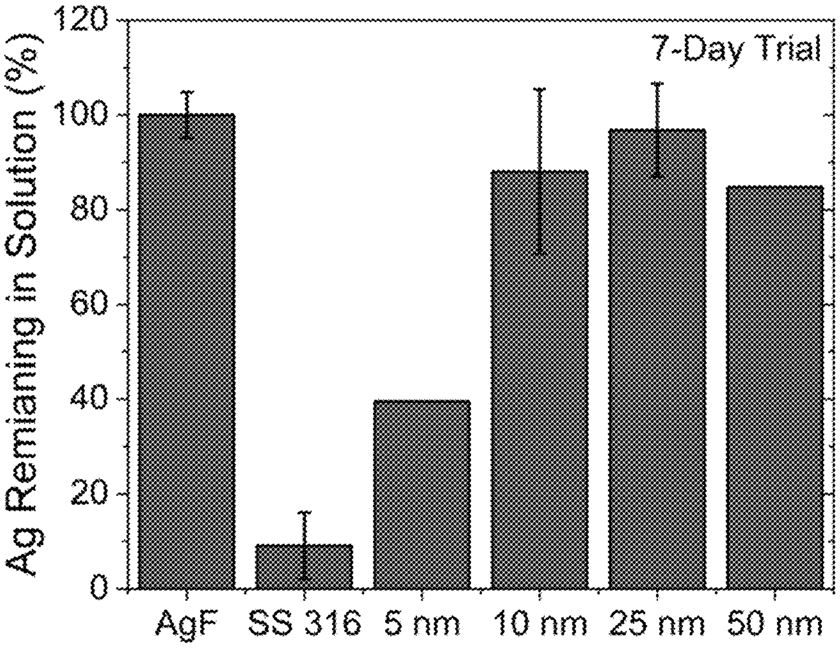
FIG. 5A shows the percentage of silver (Ag) remaining in a 0.4 ppm AgF solution after exposure to pristine 316L SS and $Al_2O_3$-functionalized 316L SS with coating thicknesses of 5 nm, 10 nm, 25 nm, and 50 nm.

ICP-MS results for the 7-day experiments indicate that a minimum thickness is preferable for good retention of silver in solution when in contact with $Al_2O_3$-coated SS. Silver loss decreased with increasing coating thickness. FIG. 5A shows an example in which a thickness of 25 nm provides the optimal protection against silver loss. After 7 days in contact with 0.4 ppm AgF solution at a S/V ratio of 2, the 25 nm $Al_2O_3$ coated SS sample had >98% silver retention. When compared to similar experimental conditions for polymer-coated SS samples, the 2D alumina coating matches or exceeds the performance of the polymer coating in terms of silver loss protection.

Figure 5B:
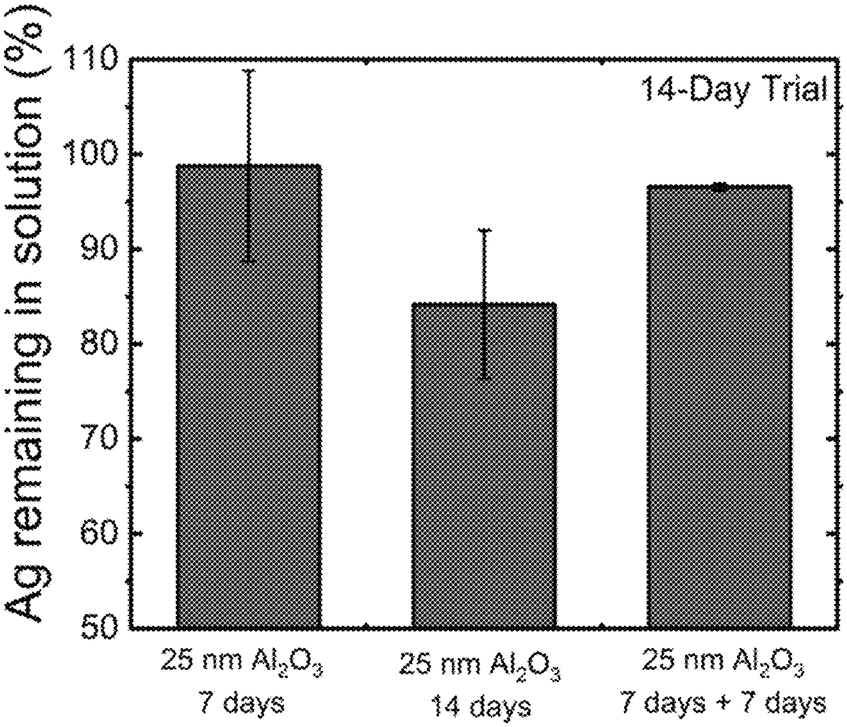
FIG. 5B shows the percentage of Ag remaining in a 400 ppb AgF solution after being exposed to a 25 nm $Al_2O_3$-coated 316L SS coupon for 7 days, 14 days, or 14 days with a change in the AgF solution after 7 days (7 days+7 days).

Prolonging the exposure to 14 days resulted in higher silver loss compared to 7 days. For the optimal coating thickness of 25 nm, the silver concentration decreases from 98.8% of the initial 0.4 ppm concentration at 7 days to 83.2% of the initial concentration at 14 days, shown in FIG. 2B. High silver loss is usually noted in prolonged exposure due to the initial high silver loss that "passivates" the surface to make it less reactive with silver. If the AgF solution is changed after 7 days for a total of 14 days of contact time (7 days+7 days), the 25 nm $Al_2O_3$ coated SS sample yields 96.6% silver retention, shown in FIG. 5B, in line with the results obtained with polymers.

XPS analysis of the elemental composition of the alumina-coated SS samples after exposure to AgF for 7 days is shown in Table 2. The silver loss assays suggest that silver was reacting with the alumina-coated sample, especially at a coating thickness lower than 25 nm, evidenced by the decrease in silver concentration observed in the AgF solution. However, no Ag peak was observed even on the 10 nm alumina-coated SS sample. These two results suggest that the reaction of silver ions with the alumina-coated SS samples does not occur with the alumina coating itself. At low coating thickness, silver ions are hypothesized to be able to penetrate the coating through small defects and react with the SS substrate underneath the alumina layer. This diffusion of silver ions beyond the coating can explain the silver loss observed from the AgF solution and the absence of Ag peak in the XPS spectra.

To determine if a change in pH affects the stability of the ceramic coating, 316L SS as well as 10 nm and 25 nm $Al_2O_3$-coated samples were placed inside 50 mL tubes containing deionized (DI) water at various pHs, ranging from 5 to 9. Samples were then taken out after 7 days and AFM analyses were conducted on them. For the 10 nm coated SS, no change in RMS surface roughness value was noted after exposure to the different pH conditions, suggesting no alteration in the coating morphology. For the 25 nm sample, which had initially higher RMS surface roughness values, a decrease in RMS value was observed for the pH 9 conditions. However, visual and AFM images of the coating did not show coating damage, and alumina is expected to be stable at pH 9.

Nanoindentation analysis was carried out to characterize the mechanical properties of the alumina coating. The indentation modulus was found to change with the indentation depth, as the indentation probe penetrated deeper into the alumina layer and eventually into the SS substrate, which is softer than alumina. A transition zone, between 30 and 40 nm penetration depth, was found where the modulus value changed from being mostly coating-related (with a value of ~145 GPa) to being a mixture of the properties of the coating and the substrate (resulting in a decrease in the indentation modulus). A similar trend was found for the indentation hardness. The hardness value of the alumina layer was found to be ~11 GPa. Because of limitations related to the minimum penetration depth required for reproductive indentation data, only the 50 nm-coated sample was measured. The "weathered" samples, which were exposed to the different water chemistries, were all 25 nm coatings and could not be measured.

To evaluate the coating detachment from the SS surface under high shear forces, a water jet system was used which included a waterjet cell, pump tubing, peristaltic pump and a solution reservoir. The water jet cell was customized from a 2.5-inch PVC compression coupling (Homewerks World-wide) to hold the coupons at a fixed location and prevent water splash. A clear plastic tube was positioned between the water jet and the location at which the water hit the coupon to provide a view of the water stream accurately coming in contact with the coupon. Samples of pristine SS 316 and SS 316 with coatings having thicknesses of 10 nm and 25 nm were placed on a circular opening and positioned to be visible in the water stream. The bottom polytetrafluoroethylene (PTFE) cushion provided support for the SS coupon, while the top gasket had a circular hole (Ø=0.634 cm) to expose ~0.32 $cm^2$ membrane to the water jet from a vertical direction.

On the upper end of the coupling, a ⅛" jet nozzle (gauge 16 needle) was fixed on the top of the coupling and connected to a ¼" pump tubing. The waterjet cell was fixed on a metallic stand using two clamps to maintain a vertical position. Additionally, 1 L of deionized water was poured inside a plastic beaker which served as the water reservoir. Then, coupons were exposed to the water stream for 5, 10, 15, and 30 minute contact times. After each time interval, the system was stopped and 15 mL sample of the water in the reservoir was collected.

To characterize the surface coatings after being exposed to the high shear forces of the water jet system, optical microscopy images were taken of the SS coupons. Analysis indicated that SS coatings with 10 nm coating thickness sample had an imprint which could potentially be the circle of the seal edge, whereas the 25 nm coating thickness sample showed no abnormalities. The 25 nm coating thickness appeared to be stable under the water jet conditions.

Figure 6:
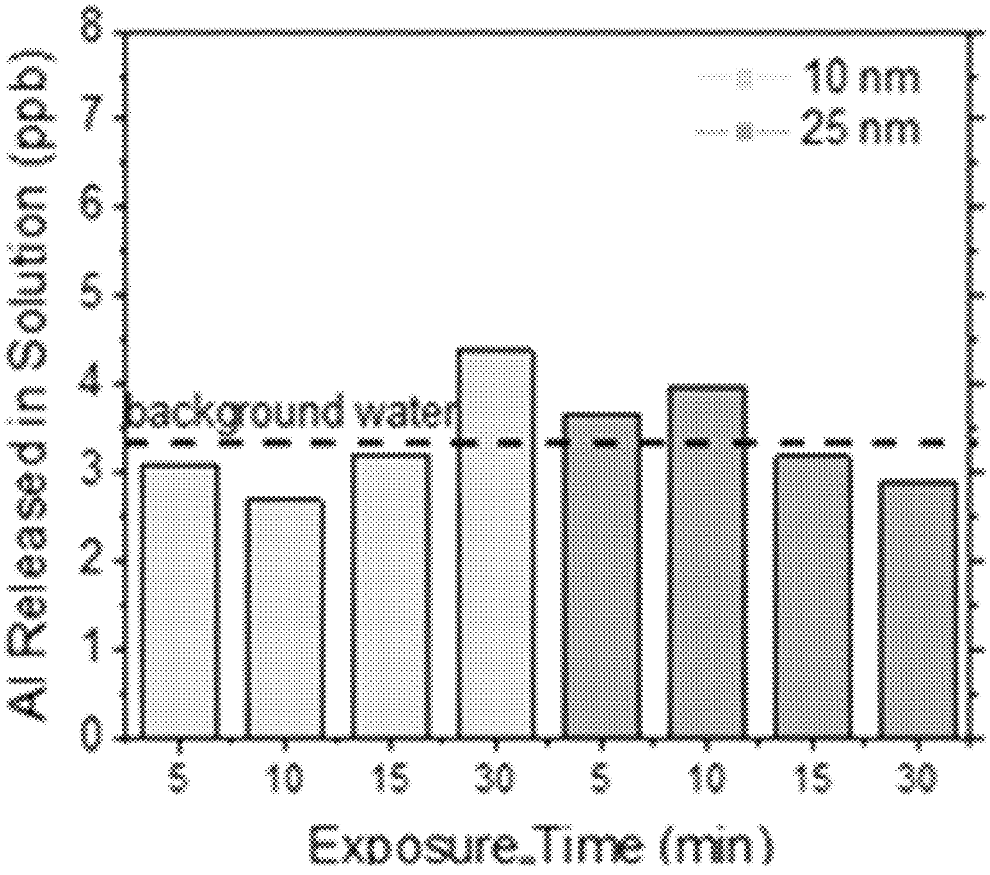
FIG. 6 shows the amount of aluminum released after exposing the samples of FIG. 1 to a water jet system for 5-30 min.

The 15 mL water samples were characterized using ICP-MS. FIG. 6 shows the amount of aluminum measured in the water after different water jet operation time for SS coated with 10 nm and 25 nm $Al_2O_3$. Light and dark shaded bars represent 10 nm $Al_2O_3$, and 25 nm $Al_2O_3$-coated samples, respectively. FIG. 6 shows no significant increase in aluminum concentration during the water jet experiments for the alumina coated samples compared to the background water. These results suggest no dissolution or release of the alumina coating under hydraulic water jet.

Figure 7:
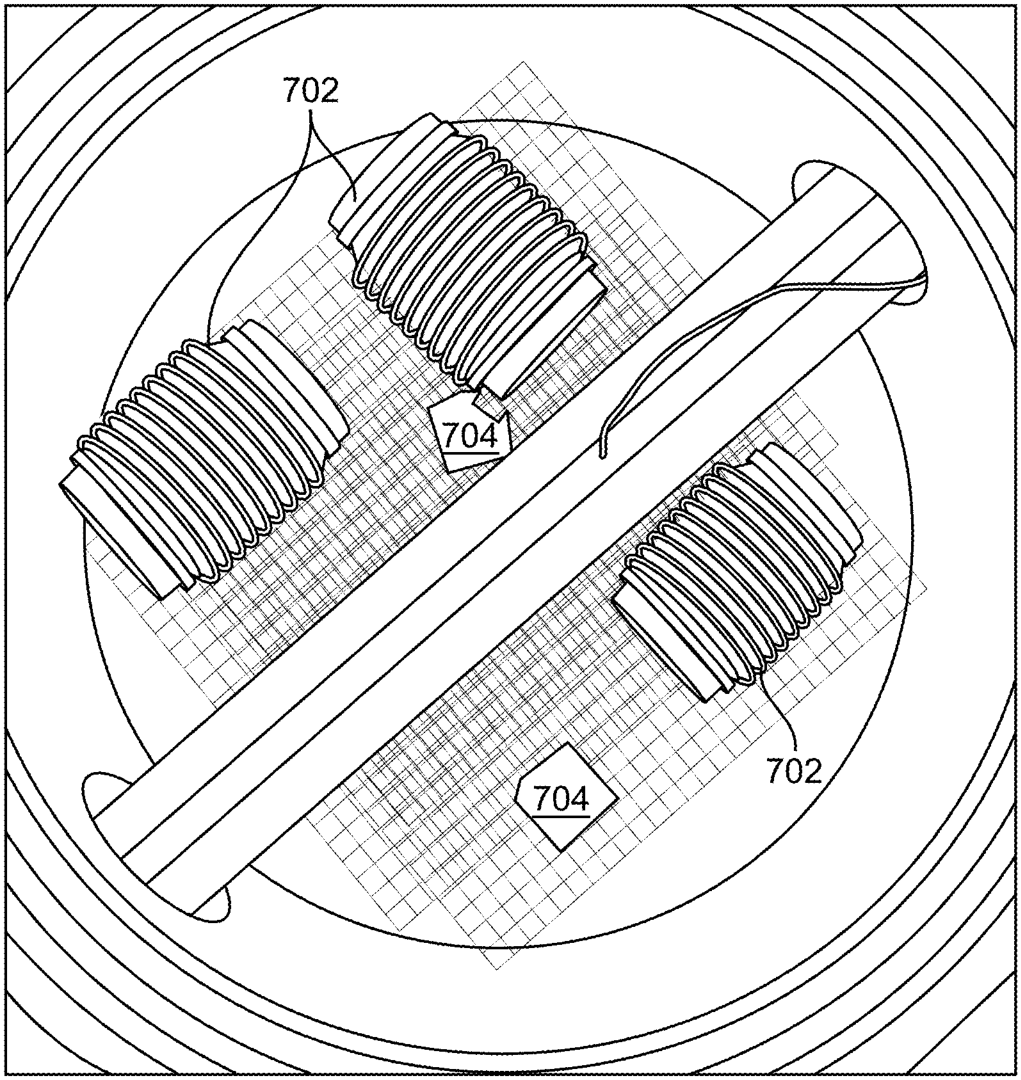
FIG. 7 is a photograph of stainless steel flex bellows and silicon wafers coated with 25 nm of $Al_2O_3$ as described herein.

To further investigate and determine the effectiveness of these 2D alumina coatings on complex large-scale SS structures used in biocidal water purification systems, complex geometries including high-purity SS tubing (SWAGELOK©) and flex bellows were functionalized with a ceramic coating by using the ALD technique. FIG. 7 is a photograph of flex bellows 702 coated with 25 nm $Al_2O_3$. To monitor the coating process, silicon wafer samples 704 were also included in the same chamber, so that the alumina film thickness could be verified.

The samples were heated to 180° C. over the course of ~4 hrs. In-situ quartz crystal microbalance monitoring indicated a typical TMA/water growth per cycle of 36 $ng/cm^2$/cycle, which resulted in a standard alumina ALD growth of ~0.12 nm/cycle. No significant change in the tint on the SS flex bellows 702 was observed, which is typical for such thin $Al_2O_3$ films. Ellipsometry on the silicon wafer samples 704 yielded an alumina coating thickness of 27.4 and 27.8 nm. These results indicate that the alumina coating was deposited as intended.

Although this disclosure contains many specific embodiment details, these should not be construed as limitations on the scope of the subject matter or on the scope of what may be claimed, but rather as descriptions of features that may be specific to particular embodiments. Certain features that are described in this disclosure in the context of separate embodiments can also be implemented, in combination, in a single embodiment. Conversely, various features that are described in the context of a single embodiment can also be implemented in multiple embodiments, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular embodiments of the subject matter have been described. Other embodiments, alterations, and permutations of the described embodiments are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Accordingly, the previously described example embodiments do not define or constrain this disclosure. Other changes, substitutions, and alterations are also possible without departing from the spirit and scope of this disclosure.

What is claimed is:

1. A method of coating a metallic substrate, the method comprising:

disposing a first ceramic coating layer on the metallic substrate, wherein disposing the first ceramic coating layer on the metallic substrate comprises contacting the metallic substrate with trimethylaluminum at a temperature in a range of 1700° C. to 1900° C. to form a layer of aluminum oxide on the metallic substrate; and disposing one or more additional ceramic coating layers on the first ceramic coating layer to yield a laminated substrate, wherein a total thickness of the ceramic coating layers on the laminated substrate is in a range of 2 nm to 200 nm.

2. The method of claim 1, wherein the total thickness of the ceramic coating layers on the laminated substrate is in a range of 5 nm to 50 nm.

3. The method of claim 1, wherein disposing the first ceramic coating layer or disposing the one or more additional ceramic coating layers comprises atomic layer deposition.

4. The method of claim 1, wherein disposing the first ceramic coating layer or disposing the one or more additional ceramic coating layers comprises chemical vapor deposition.

5. The method of claim 1, wherein the metallic substrate comprises a metal or metal alloy.

6. The method of claim 1, wherein the metallic substrate comprises stainless steel or titanium.

7. The method of claim 1, wherein the metallic substrate comprises a component of a biocidal water purification system.

8. The method of claim 1, wherein the metallic substrate comprises a medical device.

* * * * *